US006819612B1

(12) United States Patent
Achter (10) Patent No.: US 6,819,612 B1
(45) Date of Patent: Nov. 16, 2004

(54) APPARATUS AND METHOD FOR A SENSE AMPLIFIER CIRCUIT THAT SAMPLES AND HOLDS A REFERENCE VOLTAGE

(75) Inventor: Michael Achter, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/389,149

(22) Filed: Mar. 13, 2003

(51) Int. Cl.[7] .............................................. G11C 7/00
(52) U.S. Cl. .................. 365/205; 365/189.11; 365/203
(58) Field of Search ........................... 365/185.21, 205, 365/207, 190, 203, 189.11, 189.08, 196

(56) References Cited

U.S. PATENT DOCUMENTS

| | | | | |
|---|---|---|---|---|
| 4,694,205 A | * | 9/1987 | Shu et al. | ...................... 327/53 |
| 6,515,926 B1 | * | 2/2003 | Parris et al. | ................. 365/205 |
| 6,657,471 B1 | * | 12/2003 | Curran et al. | ................ 327/211 |

OTHER PUBLICATIONS

Christanthopoulos, A. et al, "A New Flash Memory Sense Amplifier In 0.18μm CMOS Technology," 0–7803–7057–0/01 ©2001, IEEE.

* cited by examiner

Primary Examiner—Richard Elms
Assistant Examiner—Hien Nguyen
(74) Attorney, Agent, or Firm—Wagner, Murabito& Hao LLP (57) ABSTRACT

A sense amplifier circuit. Specifically, a sample and hold sense amplifier circuit that is capable of sampling and holding a reference voltage comprises a reference voltage sampler circuit coupled to a cross-coupled inverter latch. The reference voltage sampler circuit is coupled to a bitline associated with a memory cell. The reference voltage is sampled from a precharge voltage taken off the bitline, and is used to read a state on a memory cell. The cross-coupled inverter latch is also coupled to the bitline, and is used for amplifying a voltage difference between an output voltage from the cross-coupled inverter latch and the reference voltage. The output voltage is based on a static bitline voltage from the bitline.

26 Claims, 9 Drawing Sheets

APPARATUS AND METHOD FOR A SENSE AMPLIFIER CIRCUIT THAT SAMPLES AND HOLDS A REFERENCE VOLTAGE

TECHNICAL FIELD

The present invention relates to the field of microelectronic integrated circuits. Specifically, the present invention relates to a sense amplifier circuit that is capable of sampling and holding a reference voltage.

BACKGROUND ART

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash, memory cell includes a source, drain, floating gate and control gate to which various voltages are applied to program the cell with a binary 1 or 0, or erase all of the cells as a block. The flash memory cell provides for non-volatile data storage.

A typical configuration of a flash memory cell consists of a thin, high-quality tunnel oxide layer sandwiched between a conducting polysilicon floating gate and a crystalline silicon semiconductor substrate. The tunnel oxide layer is typically composed of silicon oxide ($Si_xO_y$). The substrate includes a source region and a drain region that can be separated by an underlying channel region. A control gate is provided adjacent to the floating gate, and is separated by an interpoly dielectric. Typically, the interpoly dielectric can be composed of an oxide-nitride-oxide (ONO) structure.

The flash memory cell stores data by holding charge within the floating gate. In a write operation, charge can be placed on the floating gate through hot electron injection, or Fowler-Nordheim (F-N) tunneling. In addition, F-N tunneling can be typically used for erasing the flash memory cell through the removal of charge on the floating gate.

Figure 1:
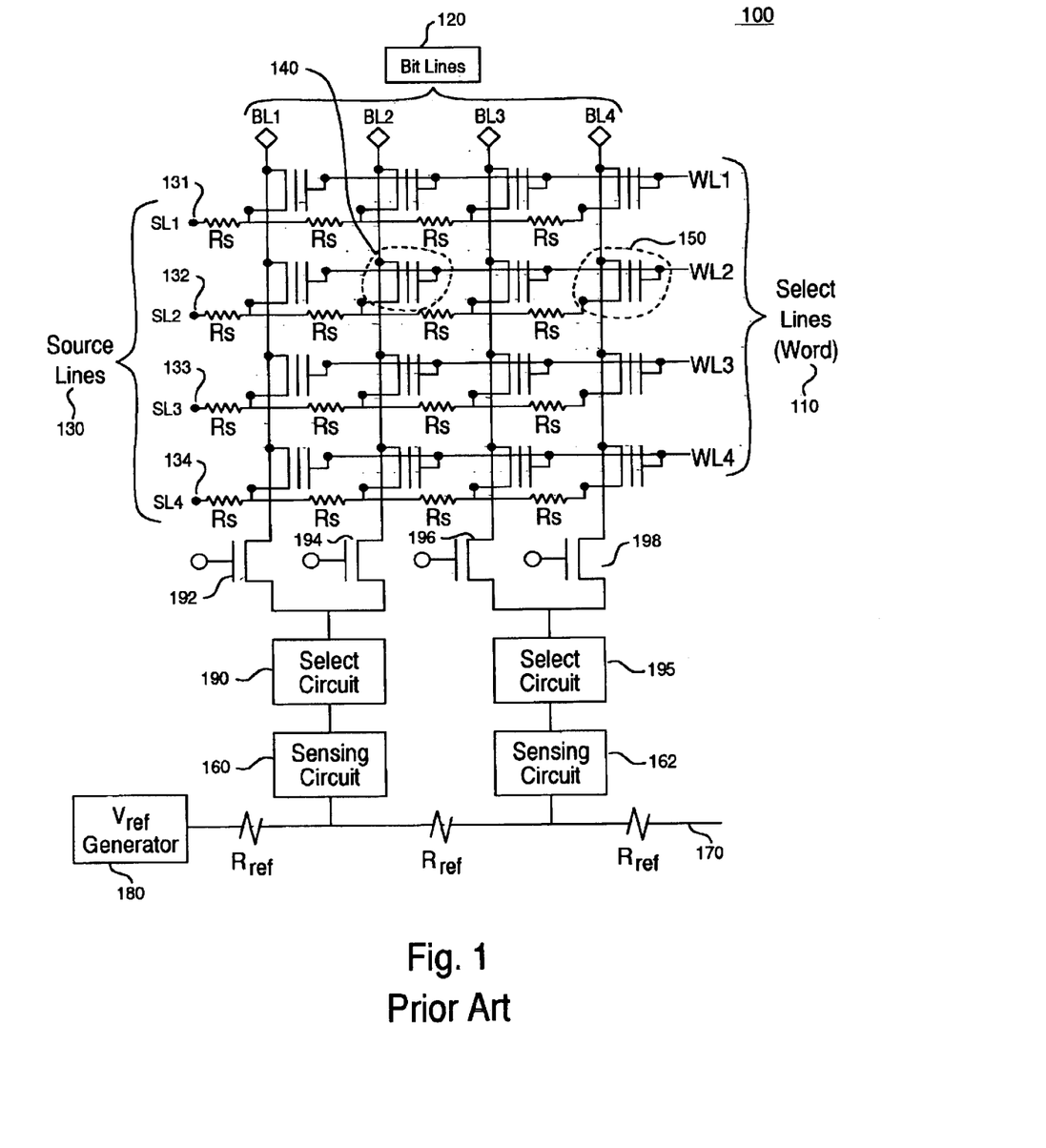
FIG. 1 is a circuit diagram illustrating the variation in reference voltage due to line resistance in an array of memory cells.

Prior Art FIG. 1 is a circuit diagram of a portion of an array 100 of memory cells arranged in a NOR type of configuration. The array 100 contains non-volatile flash memory cells arranged in rows and columns. A plurality of word lines 110, or select lines, are coupled to a plurality of rows of memory cells. The plurality of word lines 110 include WL1, WL2, WL3, and WL4. Each of the plurality of word lines 110 are coupled to gate regions of memory cells in their respective rows. For example, WL1 is coupled to gate regions of memory cells defined by WL1-B1, WL1-BL2, WL1-BL3, and WL1-BL4, etc.

In addition, a plurality of bit lines 120 are coupled to a plurality columns of memory cells. The plurality of bit lines 120 include BL1, BL2, BL3, and BL4. The plurality of bit lines are coupled to drain regions of memory cells in their respective columns. For example, BL1 is coupled to drain regions of memory cells defined by WL1-BL1, WL2-BL1, WL3-BL1, and WL4-BL1.

A plurality of source lines 130 are coupled to each of the rows of memory cells. The plurality of source lines include SL1, SL2, SL3, and SL4. In one example, each of the plurality of source lines 130 are coupled to source regions of memory cells in their respective rows. For example, SL1 is coupled to source regions of memory cells defined by WL1-BL1, WL1-BL2, WL1-BL3, and WL1-BL4, etc. In another case, all the source lines are coupled together to form a common source line.

In the array 100 of memory cells, a particular memory cell can be identified and read to determine if the cell is programmed or erased by applying the correct voltages to a corresponding bit line and word line. For example, in order to read the memory cell 140, appropriate voltages would be applied to bit line BL2 and word line WL2 to read the state of memory cell 140. Correspondingly, in order to read the memory cell 150, appropriate voltages would be applied to bit line BL4 and word line WL2 to read the state of memory cell 150.

The plurality of bit lines 120 can be used to read current from identified memory cells in the array 100 of memory cells. For example, in order to determine the state of memory cell 140, appropriate voltages are applied to BL2, SL2, and WL2. When selected and activated, the memory cell 140 will produce a current through its respective drain region that is read from the bit line BL2.

In reading the memory cell 140, the current from bit line BL2 passes through the transistor 194 that is activated by the select circuit 190. The select circuit 190 selects either transistor 192 and 194 to read current from bit line BL1 and BL2, respectively. After passing through the transistor 194 and the select circuit 190, the current on BL2 goes to the sensing circuit 160. The sensing circuit 160 compares the voltage corresponding to the current from BL2 with the reference voltage supplied along line 170 to determine whether the memory cell is in a programmed (0) or erased (1) state.

For example, if the current from memory cell 140 is less than the reference current, then the memory cell 140 is in a programmed state (0), and its corresponding threshold voltage (VT) is very high and should be higher than the reference voltage generated by the voltage generator 180 of the reference cell. Correspondingly, if the current from memory cell 140 is more than the reference current, then the memory cell 140 is in an erased state (1), and its corresponding VT should be lower than the reference voltage.

Correspondingly, select circuit 195 selects either transistor 196 and 198 to read current from bit line BL3 and BL4, respectively. The voltage corresponding to the current from the bit lines BL3 and BL4 is compared to the reference voltage from the reference voltage generator 180 in the sensing circuit 162.

The reference voltage and a corresponding reference current (i.e., reference signals) are generated from a circuit 180 independent of the array 100 of memory cells. The reference voltage and reference current are then delivered throughout the array 100 of memory cells for use in reading the state of individual memory cells. The distribution of the reference voltage and current throughout the array 100 of memory cells becomes more difficult and expensive as voltage outputs of power supplies used to operate devices containing the array 100 of memory cells are reduced in magnitude.

Specifically, a variation in reference voltages and reference currents will exist due to line resistance used for distributing the reference signals throughout the array 100 of memory cells. Simply put, there is a degradation in the reference signal the further from the location where the reference signals are generated. For example, line resistance $R_{ref}$ exists between each of the sensing circuits (e.g., circuit 160 and 162). As a result, the reference voltage taken along line 170 will vary depending on how much line resistance $R_{ref}$ is encountered.

To compensate for this variation in the reference voltage due to line resistance, a margin for error is tolerated between the reference signals and the sensed signals to properly determine a programmed or erased state. However, as operating voltages are reduced, the margin for error also becomes smaller. As such, fabrication tolerances also must meet tighter tolerances to compensate for the reduced margin for error, and could result in lower yields.

Furthermore, high power amplifiers in the periphery of a memory device are used to magnify the difference in signal strength between the reference signal and a signal coming from a memory cell in the array 100 of memory cells. These high power amplifiers take up critical space in memory device especially as the size of the memory device is reduced.

Moreover, the high power amplifiers continually consume power when the device containing the array 100 of memory cells is operating. Whether or not the any of the memory cells in the array 100 is being read, the high power amplifier still continues to consume power, which leads to shortened battery life before recharging.

DISCLOSURE OF THE INVENTION

A sense amplifier circuit is disclosed. Specifically, embodiments of the present invention disclose a sample and hold sense amplifier circuit that is capable of sampling and holding a reference voltage. Embodiments of the present invention disclose a sample and hold sense amplifier circuit that comprises a reference voltage sampler circuit coupled to a cross-coupled inverter latch. The reference voltage sampler circuit is coupled to a bitline associated with a memory cell. The reference voltage is sampled from a precharge voltage taken off the bitline, and is used to read a state on an associated memory cell. The cross-coupled inverter latch is also coupled to the bitline, and is used for amplifying a voltage difference between an output voltage from the cross-coupled inverter latch and the reference voltage. The output voltage is based on a static bitline voltage from the bitline.

BRIEF DESCRIPTION OF THE DRAWINGS

PRIOR ART

DESCRIPTION OF THE PREFERRED EMBODIMENTS

Reference will now be made in detail to the preferred embodiments of the present invention, a sensing circuit that is capable of sampling and holding a reference voltage used to determine states of memory cells. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a sensing circuit that is capable of sampling and holding a reference voltage based on a precharge voltage of a bitline corresponding to a memory cell whose state is being read. As such, embodiments of the present invention are more efficient than the circuits of the prior art by providing a reference voltage that is consistent throughout an array of memory cells. This leads to requiring less margins between the programmed and erased states in a memory cell, which results in higher yields. In addition, embodiments of the present invention use less power than sensing circuits of the prior art, by providing for the amplification of the difference between the reference voltage and the static voltage on a bitline without including additional high power amplifiers.

Figure 2:
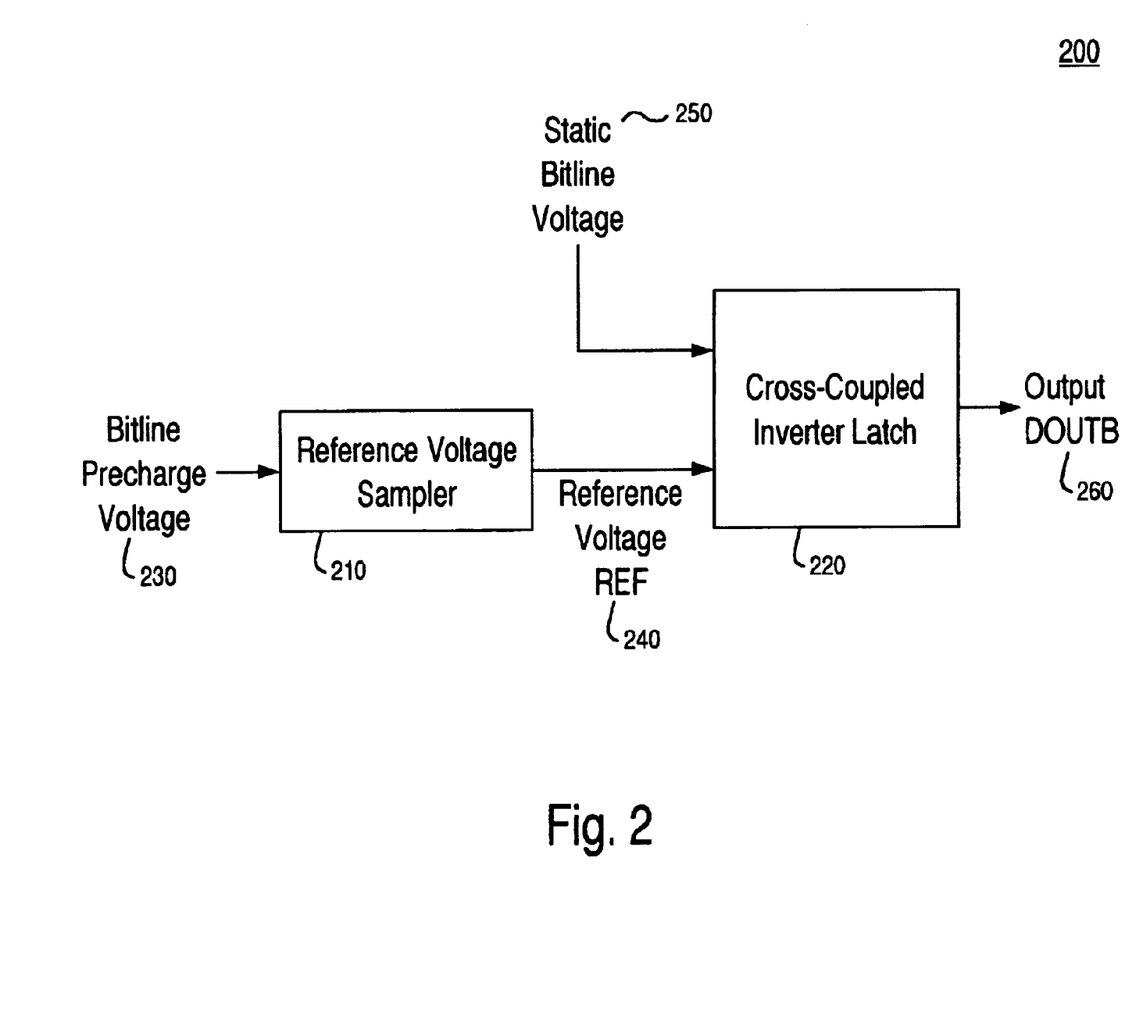
FIG. 2 is a block diagram of a sense amplifier that is able to sample and hold a reference voltage, in accordance with one embodiment of the present invention.

FIG. 2 is a block diagram illustrating a sense amplifier 200 that is capable of sampling and holding a reference voltage 240, in accordance with one embodiment of the present invention. The sense amplifier 200 eliminates reference voltage generation by sampling the bitline precharge level to set a reference voltage 240. The reference voltage 240 is used for reading a state on a memory cell in an array of memory cells, such as, an array of flash memory cells.

The sense amplifier 200 is comprised of a reference voltage sampler 210 that is coupled to a cross-coupled inverter latch 220. The reference voltage sampler 210 is used for sampling and holding a reference voltage from a precharge voltage 230 of a bitline that is coupled to a drain region of a memory cell from which the state is being determined. The output to the reference voltage sampler 210 is a reference voltage REF 240.

After the voltage on the bitline reaches a steady state, the cross-coupled inverter latch 220 compares the static voltage 250 from the bitline against the reference voltage REF 240.

The static voltage 250 is the voltage on the bitline associated with the memory cell from which the state is being determined. The static voltage is achieved by allowing the voltage on the memory cell to reach a steady state after being precharged to a precharge voltage. The difference between the static voltage 250 and the reference voltage REF 240 is used to determine the state of the memory cell.

As such, the reference voltage 240 and the static voltage 250 from the bitline are provided as inputs to the cross-coupled inverter latch 220. The output 260 from the cross-coupled inverter latch 220 is used to determine the state of the memory cell from which the state is being determined. Generally, the output voltage 260 mirrors the static voltage 250 from the bitline.

More specifically, the cross-coupled inverter latch amplifies the difference between the reference voltage and the static voltage 250 which is reflected in the output voltage DOUTB 260. Specifically, if the static voltage 250 is greater than the reference voltage REF 240, the cross-coupled inverter latch sends the output voltage DOUTB 260 high and the reference voltage REF 240 low. On the other hand, if the reference voltage REF 240 is greater than the static voltage 250 from the bitline, then the cross-coupled inverter latch sends the reference voltage REF 240 high and the output voltage DOUTB 260 low.

In summary, cross-coupled inverter latch 260 pulls high the greater of the reference voltage 240 and the static voltage 250, as seen on the output voltage DOUTB 260. The voltage when pulled high, in one embodiment, goes to the supply voltage (Vcc). Correspondingly, the cross-coupled inverter latch pulls low the lesser of the reference voltage 240 and the static voltage 250, as seen on the output voltage DOUTB 260. The voltage when pulled low, in one embodiment, goes to ground, or Vss.

The voltage signal on the output 260 (high or low) can be used to determine the state of the memory cell being read. Depending on the configuration of the array of memory cells, a digital output of a 1 or 0 can indicate whether the particular memory cell being read is programmed or erased. For example, in one configuration, a NOR type array of flash memory cells is configured in which a high output 260 of 1 indicates that the particular memory cell is programmed. Also, a low output 260 of 0 indicates that the particular memory cell is erased. In this configuration, output 260 indicates the inverse of the state of the memory cell.

Although, the present embodiment discloses the sensing of a static bitline voltage 250 through the cross-coupled inverter latch, other embodiments are well suited to sensing the bitline voltage under non-static conditions. For example, if the timing is sufficiently relaxed, the output voltage DOUTB 260 will remain at the precharge voltage for a memory cell that is programmed and will discharge to Vss, or ground, for a memory cell that is erased. As such, proper measurements of the bitline voltage can occur prior to a static condition that shows the memory cell as being fully discharged. When programmed, the bitline voltage will remain static at the output voltage DOUTB 260 no matter how much time has elapsed. When erased, the bitline voltage will discharge, but the sensing of the state of the memory cell can occur while the bitline voltage is discharging. In this case, the output voltage DOUTB 260 will swing to Vss prior to reaching a static state in the bitline.

Figure 3:
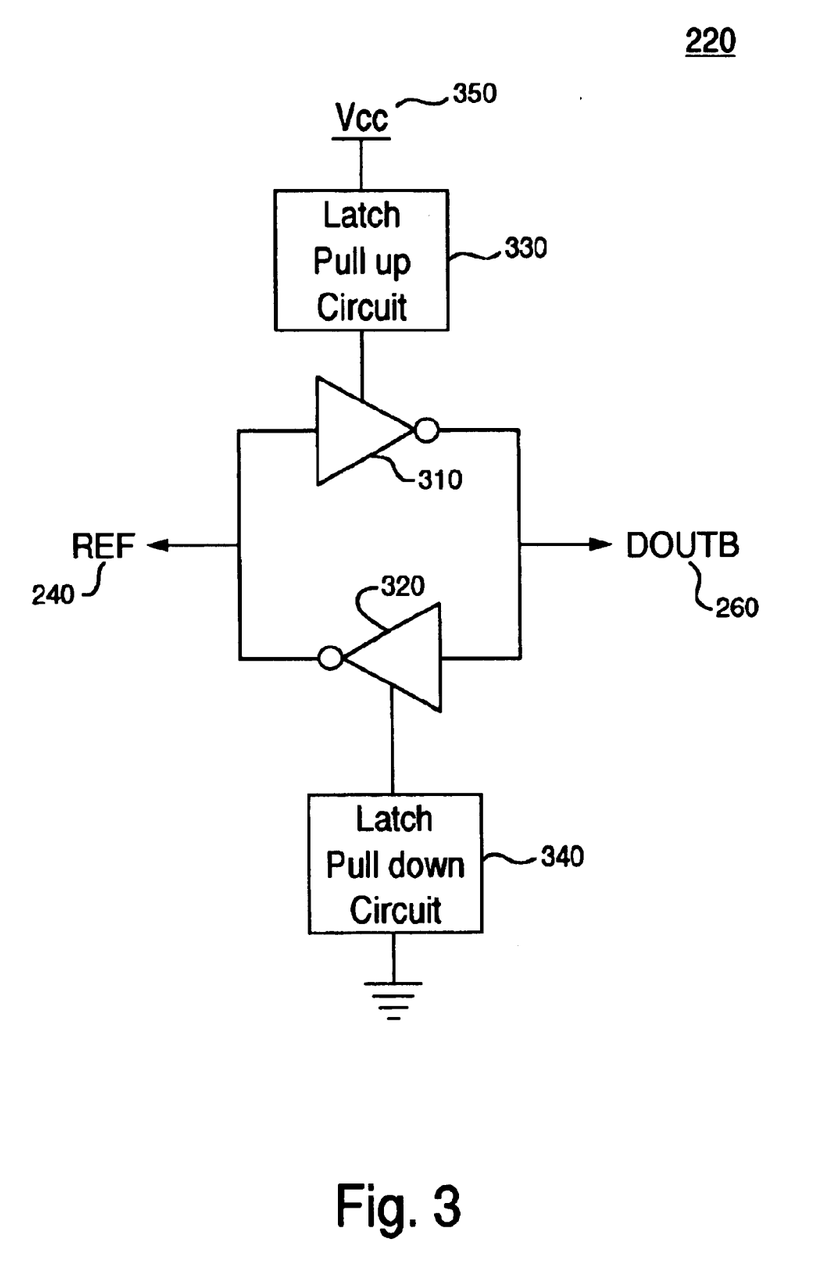
FIG. 3 is a simplified circuit diagram of a cross-coupled inverter latch used in the sense amplifier of FIG. 2, in accordance with one embodiment of the present invention.

FIG. 3 is a simplified element diagram of the cross-coupled inverter latch 220, in accordance with one embodiment of the present invention. The cross-coupled inverter latch 220 of FIG. 3 is comprised of a top inverter amplifier 310 coupled to a latch pull up circuit 330. The latch pull up circuit 330 is coupled to a supply voltage Vcc 350. In addition, the also comprised of lower inverter amplifier 320 that is cross-coupled with the top inverter amplifier 310. The lower inverter amplifier 320 is coupled to a latch pull down circuit 340. The latch pull down circuit 340 is coupled to ground.

The cross-coupled inverter latch 220 of FIG. 3 amplifies the difference between the voltage REF 240 and the static voltage 250 of the bitline, after the bitline associated with the memory cell being read is allowed to reach a steady state. The voltage difference is reflected in the output voltages DOUTB 260 and the REF 240, as discussed previously. As an example, the cross-coupled inverter latch 220 will change the voltage seen at the voltage REF 240 and the output voltage DOUTB 260.

Figure 4:
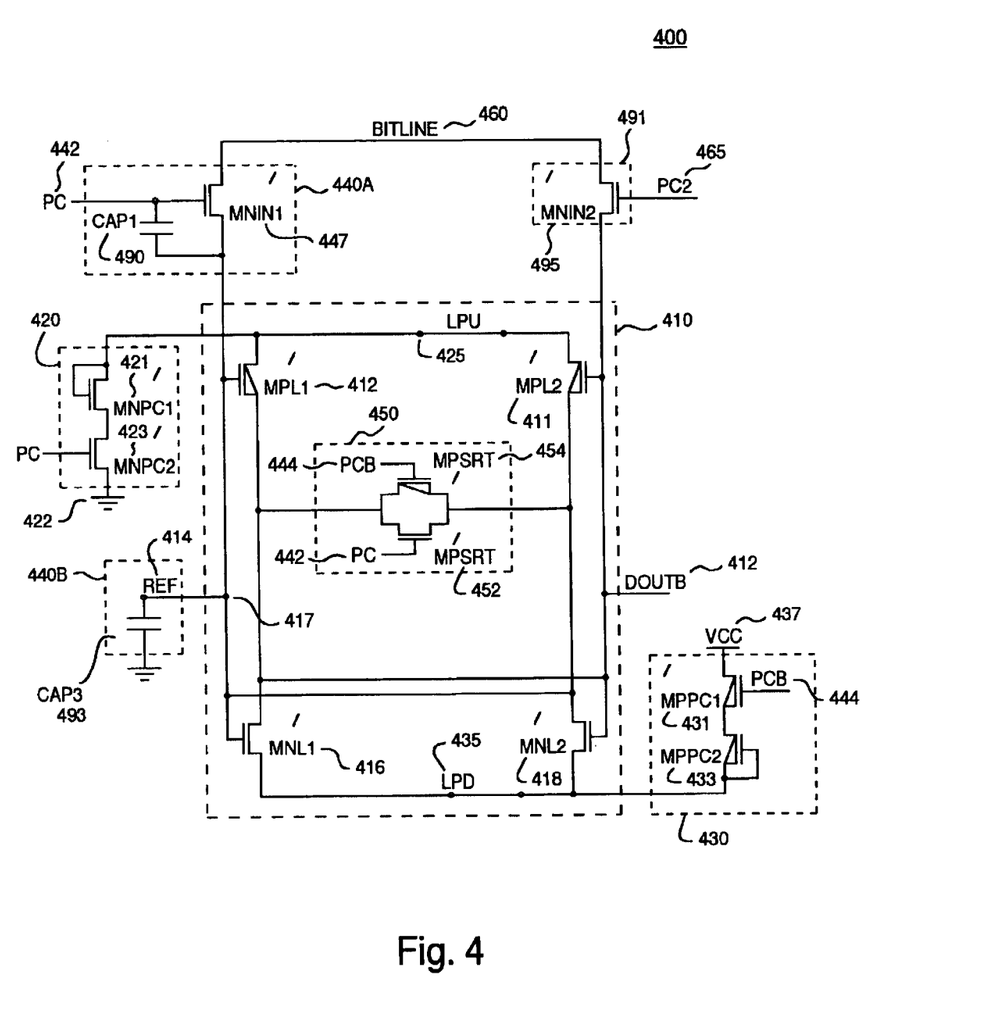
FIG. 4 is a circuit diagram of a sense amplifier that is able to sample and hold a reference voltage during a precharge cycle, in accordance with one embodiment of the present invention.

FIG. 4 is a diagram of a circuit 400 in isolation during a precharge cycle of a sense amplifier. The circuit 400, in one embodiment, is illustrative of the sense amplifier 200 of FIG. 2. The circuit 400 illustrates the elements of the circuit during a precharge cycle, in accordance with one embodiment of the present invention. The circuit 400 comprises a cross-coupled inverter latch 410 that is coupled to a reference voltage sampler circuit 440A and 440B, a bitline controller circuit 491, and precharge pulling circuits 420 and 430.

Although the present embodiment in circuit 400 discloses using metal oxide semiconductor field effect transistors (MOSFETS), other embodiments are well suited to using other forms of transistors to achieve a circuit capable of sampling and holding a reference voltage as is disclosed in the present invention.

The cross-coupled inverter latch 410 comprises p-channel metal oxide semiconductor field effect transistors (PMOS) MPL1 412 and MPL2 411, and n-channel metal oxide semiconductor field effect transistors (NMOS) MNL1 416 and MNL2 418. The transistors MPL1 412, MPL2 414, MNL1 416 and MNL2 418 are configured to form a latch of cross-coupled inverters.

During the precharge cycle, the bitline is precharged to a positive precharge voltage 460 by a separate power supply (not shown). The precharge voltage is ideally between the values as follows: one half of the threshold voltage of an NMOS transistor used in the circuit 400 (Vtn/2), and the absolute value of one half of the threshold voltage of a PMOS transistor used in the circuit 400 subtracted from the supply voltage (Vcc--|Vtp/2|), in one embodiment.

The precharge voltage 460 is the latch metastable point where the voltages REF 414 and DOUTB 412 are equal, in one embodiment when the cross-coupled inverter latch 410 is on. Ultimately, the precharge voltage 460 on the bitline is dependent on the transistor threshold voltage, supply voltage Vcc 437, and the ratio of the pullup/pulldown transistors in the cross-coupled inverter latch 410.

The precharge pulling circuits 420 and 430 are used for achieving a stable state in the cross-coupled inverter latch during a precharging cycle in which the reference voltage is sampled. The precharge pulling circuit 420 comprises two NMOSs, MNPC1 421 and MNPC2 423. The precharge pulling circuit 430 comprises two PMOSs, MPPC1 431 and MPPC2 433. The precharge pulling circuit 420 and the precharge pulling circuit 430 are used to prevent current leakage from the cross-coupled inverter latch circuit 410 by shutting off the transistors in the latch circuit 410.

During the precharge cycle, a precharge signal PC 442 is pulled high. Correspondingly, the inverse of the precharge signal PC 442 is PC bar signal 444, which is low. In addition, a second precharge signal PC2 465 is also pulled high. In one embodiment, during the precharge cycle, the precharge signals PC 442 and PC2 465 are pulled to the supply voltage Vcc 437.

When the precharge signal 442 goes high during the precharge cycle, the transistors MNPC1 421 and MNPC2 423 in the precharge pulling circuit 420 turn on and effectively pull the voltage at the latch pull up (LPU) node 425 to just above ground, about one threshold voltage of an NMOS transistor above ground. When the LPU node 425 goes low with a voltage near ground, the PMOS transistors MPL1 412 and MPL2 411 are shut off. As such, the top portion of the cross-coupled inverter latch 410 is shut off.

Also, when the precharge signal 442 goes high during the precharge cycle, the transistors MPPC1 431 and MPPC2 433 in the precharge pulling circuit 430 turn on and effectively pull the voltage at the latch pull down (LPU) node 435 up to a level just below the supply voltage Vcc 437, about one threshold voltage of a PMOS transistor below the supply voltage Vcc 437. When the LPD node 435 goes high to a voltage near Vcc, the NMOS transistors MNL1 416 and MNL2 418 are shut off. As such, the lower portion of the cross-coupled inverter latch 410 is shut off.

In addition to setting the voltages at nodes 425 and 435 low and high, respectively, during the precharge cycle, the present embodiment employs a shorting circuit 450 to ensure that the voltages REF 414 at node 417 and DOUTB 412 at node 413 are precharged to the same level. During the precharge cycle, a short is created between the node 413 representing the voltage DOUTB 412 and the node 417 representing the voltage REF 414 through the shorting circuit 450.

The transistors employed in the shorting circuit 450 are needed only to ensure that the voltages REF 414 and DOUTB 412 are equal during the precharge cycle. When the voltage REF 414 and the voltage DOUTB 412 are equal, the cross-coupled inverter latch 410 is in a stable state. As such, the shorting circuit 450 may be comprised only of either an NMOS transistor, PMOS transistor, or a combination of both the NMOS and PMOS transistors. For example, for higher supply voltages Vcc 437 around three volts, only an NMOS transistor is only needed. For lower supply voltages Vcc 437 around 1.8 volts, a PMOS transistor is only needed. The configuration of the shorting circuit 450 includes both an NMOS transistor MNSRT 452 and a PMOS transistor MPSRT 454 to account for both high and low supply voltages Vcc 437.

In the reference voltage sampler circuit 440A and 440B, when the precharge signal PC 442 goes high, the NMOS transistor MNIN1 447 acts as a pass gate and turns on to pass the precharge voltage 460 from the bitline to the cross-coupled inverter latch circuit 410. Similarly, when the precharge signal PC2 465 goes high, the NMOS transistor MNIN2 495, in the bitline controller circuit 491, acts as a pass gate and turns on to pass the precharge voltage 460 from the bitline to the cross-coupled inverter latch 410.

The NMOS transistor MNIN1 447 also sets the reference voltage 414 that is sampled by the reference voltage sampler circuit 440A and 440B, after the precharge cycle. During the precharge cycle, a voltage on the node 417 rises to the reference voltage 414. When the precharge signal PC 442 goes from high to low after the precharge cycle, the NMOS MNIN1 447 turns off which sets the reference voltage 414 at the node 417.

Because of the capacitive coupling in the reference voltage sampler circuit 440A and 440B, the reference voltage 414 is held at node 417 and can be sampled. The reference voltage 414 is equal to the precharge voltage 460 on the bitline less a threshold voltage Vt from the NMOS MNIN1 447. The capacitors CAP1 490 and CAP3 493 are optional capacitive elements that can be added to establish the correct voltage level for the reference voltage REF 414 seen at nod 417.

After the precharge cycle, the present embodiment pulls the PC signal 442 low to ground. The PC2 signal 465 still remains high. This allows for coupling between the capacitive elements from the gate to source capacitance of MNIN1 447 and the CAP 1490. This coupling generates a voltage difference between the bitline 460 and the REF 414 at node 417. In this present arrangement, the transistors in the precharge pulling circuit 420 and 430 are turned off. In addition, the transistors in the shorting circuit 450 are also turned off. As such, the node 413 representing the voltage DOUTB 412 is not directly tied to the node 417 representing the reference voltage REF 414. Thus, the reference voltage REF 414 will be lower than the DOUTB voltage and can be set for sampling.

Also, after the precharge cycle, when the PC signal 442 is pulled low to ground, the voltage on the bitline is allowed to reach its steady state. This is accomplished by disabling the precharge current source (not shown) that precharges the voltage on the bitline 460 to its precharge voltage level. As such, the steady state voltage on the bitline 460 will remain high if the memory cell associated with the bitline 460 is programmed. Correspondingly, the DOUTB voltage will remain high, so that the voltage DOUTB 412 is higher than the reference voltage 414.

Alternatively, if the memory cell sinks current, then the voltage on the bitline 460 will discharge until reaching a steady state. As such, the voltage on the bitline 460 will remain low in its steady state when the memory cell associated with the bitline 460 is erased. As a result, the DOUTB voltage 412 will go low so that the voltage DOUTB 412 is lower than the reference voltage 414.

Figure 5:
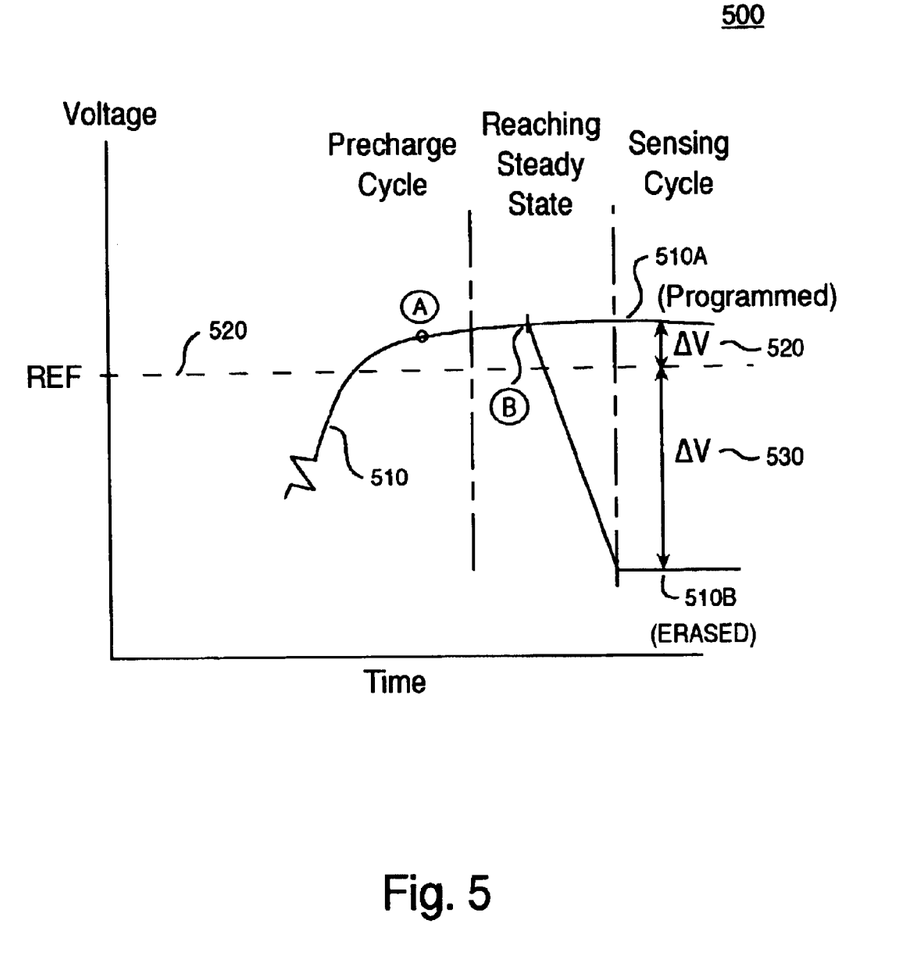
FIG. 5 is a diagram illustrating the voltage on a bitline corresponding to a memory cell from which a reference voltage is sampled and held, in accordance with one embodiment of the present invention.

FIG. 5 illustrates a voltage versus time chart illustrating the bitline voltage as seen on the bitline during a precharge cycle, a cycle in which the bitline voltage reaches a static state, and a sensing cycle. As seen in FIG. 5, the curve 510 represents the voltage on the bitline associated with a memory cell from which its state is being determined. During the precharge cycle, the curve 510 rises up to the precharge voltage at point A. The dotted line 520 represents the reference voltage as sampled from the precharge voltage determined at point A.

After the bitline is precharged to the precharge voltage at point A, the bitline is allowed to reach its steady state. At point B, the curve 510 forks into two paths 510A and 510B. When the memory cell being read is programmed, the voltage on the bitline when in a steady state remains the same (logic level 1) and is greater than the reference voltage represented by dotted line 520. On the other hand, when the memory cell being read is erased, the voltage on the bitline dissipates to a low level (logic level 0) when in its steady state and is smaller in magnitude than the reference voltage represented by dotted line 520.

Thereafter, the difference in voltages between the reference voltage represented by line 520 and the bitline voltages represented by curve 510A and 510B will be amplified to determine the state of the memory cell being read. For example, $\Delta V$ 520 represents the difference in voltages when the memory cell is programmed, and $\Delta V$ 530 represents the difference in voltages when the memory cell is erased.

Amplification of ΔV 520 and ΔV 530 occurs in the cross-coupled inverter latch circuit 410 during the sensing cycle.

Figure 6:
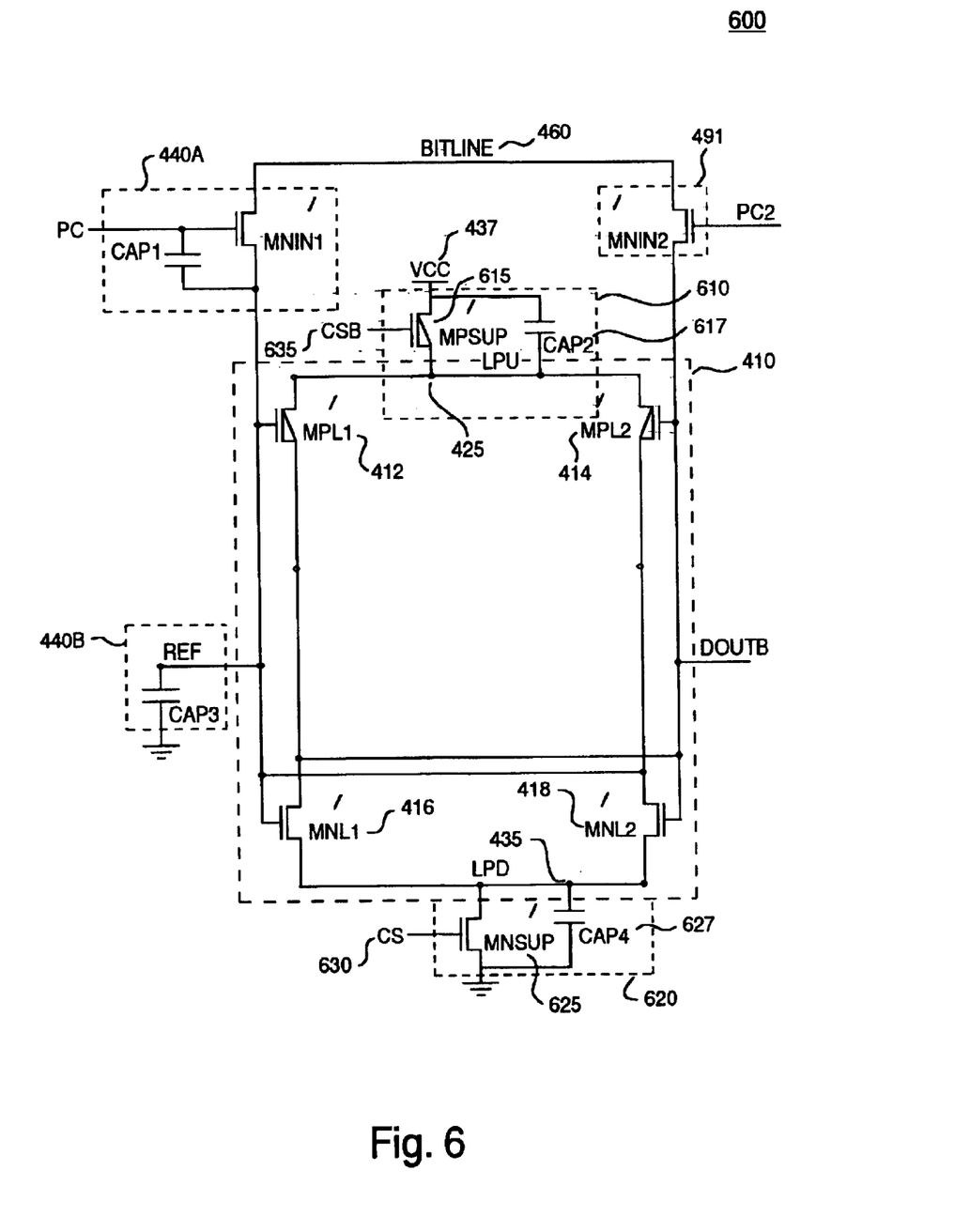
FIG. 6 is a circuit diagram of a sense amplifier that is able to sample and hold a reference voltage during a sensing cycle, in accordance with one embodiment of the present invention.

FIG. 6 is a circuit diagram illustrating a sensing circuit 600 in isolation of a sense amplifier during a sensing cycle, in accordance with one embodiment of the present invention. The circuit 400, in one embodiment, is illustrative of the sense amplifier 200 of FIG. 2. The sensing circuit 600 is capable of holding a reference voltage and amplifying a difference in a static bitline voltage and the reference voltage. The sensing circuit 600 is used in combination with the circuit 400 to form a sense amplifier that is capable of sampling and holding a reference voltage from a precharge voltage on a bitline for use to determine the state of a memory cell associated with the sampled bitline.

The sensing circuit 600 comprises the cross-coupled inverter latch 410, the reference voltage sampler circuits 440A and 440B, and the bitline controller circuit 460, as disclosed in FIG. 4. In addition, the sensing circuit 600 comprises a pull up circuit 610 and a pull down circuit 620 for enabling the transistors in the cross-coupled inverter latch 410.

The present embodiment enables the sensing circuit by pulling the PC signal 442 low and pulling the charge share (CS) signal 630 high. This occurs by after the cycle that allows the voltage on the bitline to reach a steady state. When the PC signal 442 goes low in the circuit 400 of FIG. 4, the transistors in the precharge pulling circuits 420 and 430 turn off. This allows the voltage on the bitline to reach a steady state.

Thereafter, after the bitline voltage 460 reaches its steady state, the pull up circuit 610 and pull down circuit 620 can be enabled in FIG. 6 by asserting the CS signal 630 during the sensing cycle. The pull up circuit 610 and pull down circuit 620 are enabled without any influence from the precharge pulling circuit 420 and 430. In the present embodiment, after the precharge cycle, when the PC signal 442 goes low, and during the sensing cycle, the CS signal 630 is pulled high to the supply voltage Vcc 437. Correspondingly, when CS signal 630 goes high to Vcc 437, the CS bar signal 635 goes low to ground (0). The CS signal 630 is pulled high after a sufficient amount of time has passed to ensure that the voltage at DOUTB 412 can discharge to a level lower than the reference voltage REF 414.

More particularly, the pull up circuit 610 pulls the LPU node 425 up to the supply voltage Vcc 437 during the sensing cycle. As the CS bar signal 635 goes low, the PMOS transistor MPSUP 615 in the pull up circuit 610 is enabled and pulls the LPU node 425 up to the supply voltage Vcc 437. As such, the top portion of the cross-coupled inverter latch 410, comprising the PMOS transistors MPL1 412 and MPL2 414, is enabled.

Previously, during the precharge cycle, discussing the pull up circuit 610 in relation with the circuit 400, the CS signal 630 was low (0) and the CS bar signal 635 was high. As such, during the precharge cycle, the PMOS transistor MPSUP 615 was turned off, thereby disabling the pull up circuit 610. By disabling MPSUP 615, static power dissipation through the pull up circuit 610 is avoided.

Correspondingly, the pull down circuit 620 pulls the LPD node 435 down to ground (0), during the sensing cycle. As the CS signal 630 goes high, the NMOS transistor MNSUP 625 in the pull down circuit 620 is enabled and pulls the LPD node 435 down to ground. As such, the lower portion of the cross-coupled inverter latch 410, comprising the NMOS transistors MNL1 4166 and MNL2 418, is enabled.

Previously, during the precharge cycle, discussing the pull down circuit 620 in relation with the circuit 400, the CS signal 630 was low (0). As such, during the precharge cycle, the NMOS transistor MNSUP 625 was turned off, thereby disabling the pull down circuit 620. By disabling MNSUP 625, static power dissipation through the pull down circuit 620 is avoided.

The pull up circuit 610 also comprises a capacitor CAP2 617 coupled to the PMOS transistor 615. The pull down circuit 620 also comprises a capacitor CAP4 627. The capacitors CAP2 617 and CAP4 627 are optional filtering capacitors to reduce noise signals on the LPU node 425 and the LPD node 435 so that the DOUTB voltage 412 at node 413 and the REF voltage at node 417 are more stable. Primarily, the CAP2 617 and CAP4 627 capacitors are used so that the LPD node 435 and the LPU node 425 do not couple high and low, respectively.

The parasitic capacitances associated with the PMOS transistors MPSUP 615, MPL1 412, and the MPL2 414 may be sufficient to preclude the use of the optional CAP2 617 capacitor. Also, the parasitic capacitances associated with the NMOS transistors MNSUP 625, MNL1 416, and MNL2 418 may be sufficient to preclude the use of the optional CAP4 627 capacitor.

When the pull up circuit 610 and the pull down circuit 620 are enabled, the cross-coupled inverter latch 410 also becomes enabled thereby amplifying the difference between the steady state voltage on the bitline and the reference voltage 414. Once a sufficient amount of time has elapsed to ensure that the voltage DOUTB 412 could discharge below the reference voltage 414, the CS 630 signal toggles high. Shortly after the CS signal 630 and the CS bar signal 635 toggle high and low, respectively, the PC2 signal 465 can be pulled low. This turns off the path to the bitline 460 after the cross-coupled latch has started to flip the voltages DOUTB 412 at node 413 and REF 414 at node 417 to the full Vcc 437 level or to ground.

The cross-coupled inverter latch 410 functions to swing the greater of the voltage DOUTB 412 at node 413 and reference voltage REF 414 at node 417 to the supply voltage Vcc 437. In addition, the cross-coupled inverter latch 410 functions to swing the lesser of the voltage DOUTB 412 at node 413 and the reference voltage REF 414 at node 417 to ground.

Thus, the voltage DOUTB 412 seen at node 413 will either be high at Vcc 437 or low at ground. For example, if the memory cell is in a programmed state, then the voltage DOUTB 412 will be greater than the reference voltage REF 414. As such, the cross-coupled inverter latch will swing the voltage DOUTB 412 at node 413 to Vcc 437 and the voltage REF 414 at node 417 to ground.

Alternatively, if the memory cell is in an erased state, then the voltage DOUTB 412 will be less than the reference voltage REF 414. As such, the cross-coupled inverter latch will swing the voltage DOUTB 412 to ground, and the voltage REF 414 at node 417 to Vcc 437.

Once the cross-coupled inverter latch 410 flips the voltages DOUTB 412 and REF 414 to ground or to Vcc 437, the inverter latch 410 has reached a stable state. The two possible stable states when the voltage DOUTB at node 413 and the voltage REF at node 417 are not equal are as follows: the reference voltage REF 414 at node 417 is 0, and the voltage DOUTB 412 at node 413 is Vcc 437; or the reference voltage REF 414 at node 417 is Vcc 437, and the voltage DOUTB 412 at node 413 is 0. Upon reaching the stable state, no further power is consumed by the sensing circuit 600 as described in FIG. 6.

Figure 7:
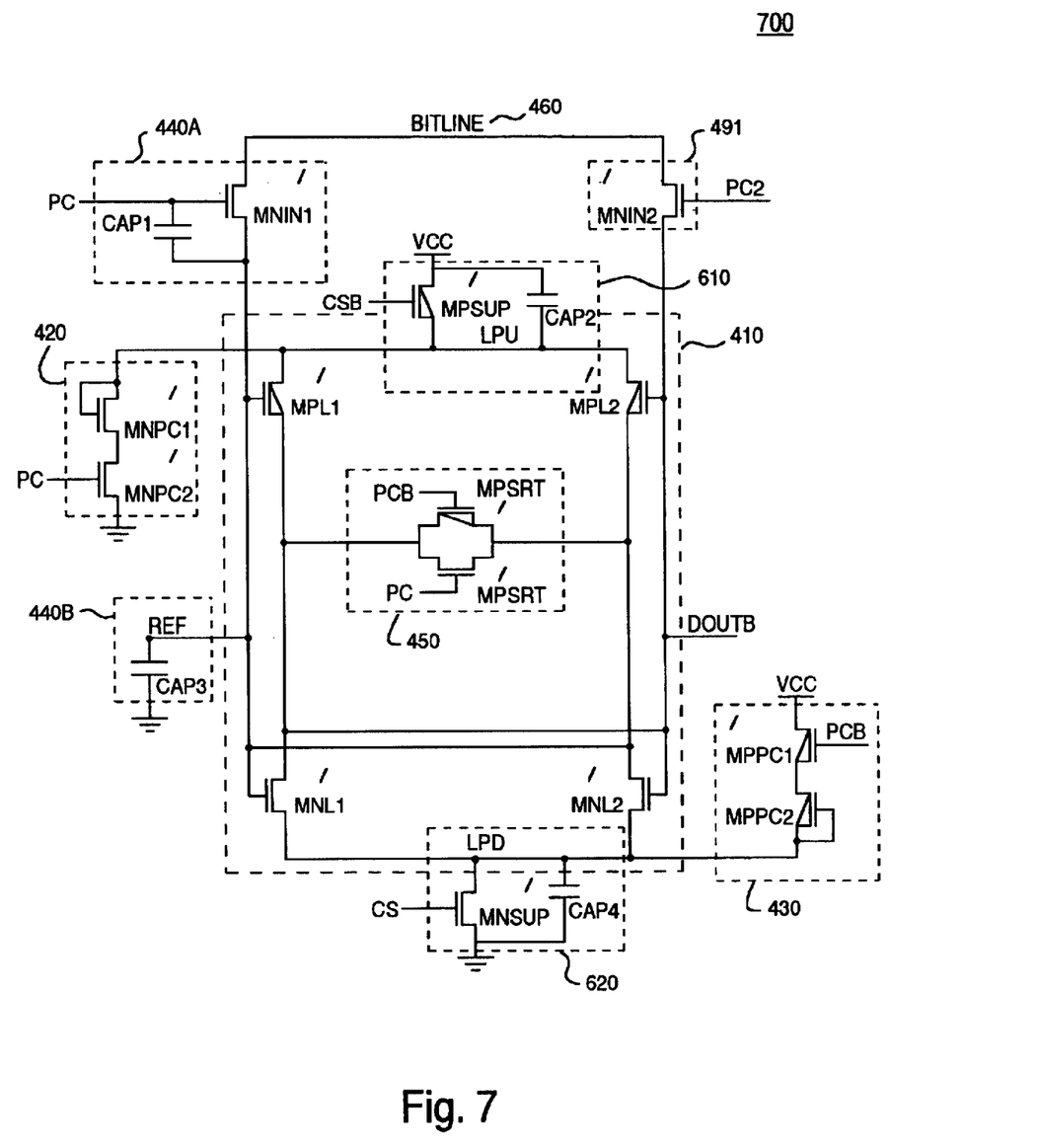
FIG. 7 is a circuit diagram combining the circuits of FIGS. 4 and 6 to form a sense amplifier capable of sampling and holding a reference voltage, in accordance with one embodiment of the present invention.

FIG. 7 is a sensing circuit 700 that is a combination of circuit 400 and circuit 600, in accordance with one embodiment of the present invention. The sensing circuit 700 is capable of sampling and holding a reference voltage based on a precharge voltage of a bitline associated with a memory cell that is being read.

More particularly, the sensing circuit 700 comprises the following circuit elements, in part: a cross-coupled inverter latch 410 that is coupled to a reference voltage sampler circuit 440A and 440B, a bitline controller circuit 491, precharge pulling circuits 420 and 430, shorting circuit 450, pull up circuit 610, and a pull down circuit 620. The particular functions of the sensing circuit 700 corresponding to the circuit elements of the sensing circuit 700 have been previously discussed in relation to the circuits 400 and, 600.

Figure 8:
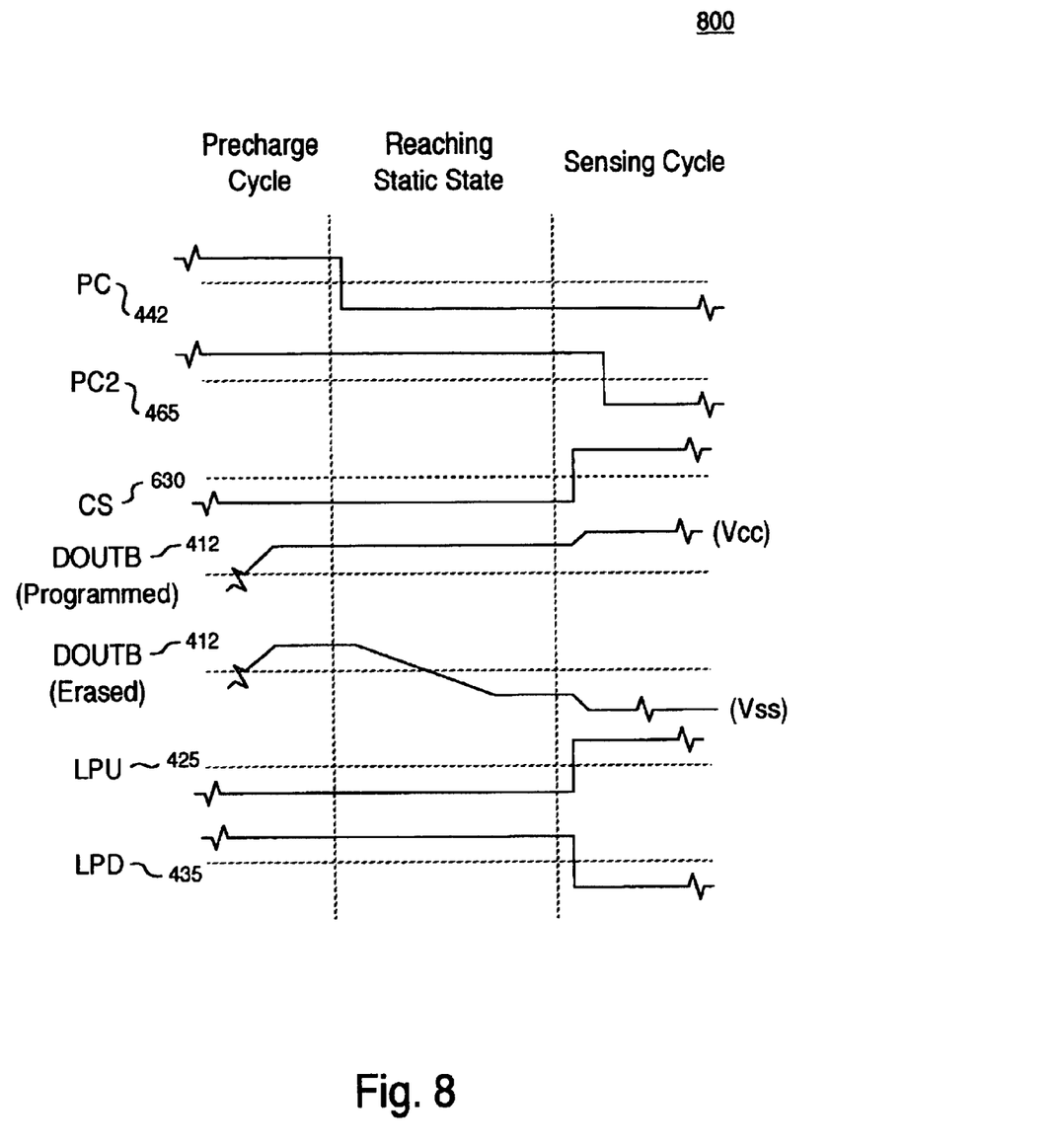
FIG. 8 is a chart illustrating signal patterns in a sense amplifier that is capable of sampling and holding a reference voltage, in accordance with one embodiment of the present invention.

FIG. 8 is a signal diagram 800 illustrating the signal patterns appearing in the circuits 400, 600, and 700, in accordance with one embodiment of the present invention. The signal diagram 800 is broken into three cycles, a precharge cycle, a cycle in which a voltage on a bitline that is associated with a memory cell that is being read, and a sensing cycle. Signal patterns shown relate to the PC signal 442, the PC2 signal 465, the CS signal 630, the voltage at DOUTB 412 for a programmed memory cell, the voltage at DOUTB 412 for an erased memory cell, the voltage at the LPU node 425, and the voltage at the LPD node 435.

As shown in FIG. 8, the PC signal 442 starts high during the precharge cycle to allow the cross-coupled inverter latch to reach a stable state in which the voltage DOUTB 412 and the reference voltage 414 are equalized. From this state, a reference voltage can be sampled. After the precharge cycle, the PC signal 442 goes low to allow the voltage on the bitline 460 to reach a steady state. Thereafter, the PC signal 442 remains low.

In the steady state, the voltage on the bitline will either remain high or discharge to ground (low). When the memory cell is in a programmed state, the memory cell does not sink any current, and the voltage on the bitline will remain high in its steady state. Similarly, the voltage DOUTB 412 will remain high. On the other hand, when the memory cell is in an erased state, the memory cell sinks current, and the voltage on the bitline will discharge low in its steady state. Similarly, the voltage DOUTB 412 will go low.

Also in FIG. 8, the CS signal 630 is shown as starting low through the precharge cycle and the cycle allowing the voltage on the bitline to reach a steady state. After a sufficient amount of time has elapsed to ensure that the voltage DOUTB 412 could discharge lower than the reference voltage REF 414, then the CS signal 630 is toggled high to enable the cross-coupled inverter latch 410.

In FIG. 8, the PC2 signal 465 also starts high during the precharge cycle to pass the voltage from the bitline 460 down to the cross-coupled inverter latch 410. During the sensing cycle, PC2 signal 465 is brought low in the present embodiment to turn off the bitline path back to the bitline 460 after the cross-coupled inverter latch 410 has started to flip the voltages seen on its outputs.

As a result of toggling the CS signal high, the pull up circuit 610 is enabled, and the voltage at the LPU node 425 also goes high. Similarly, the pull down circuit 620 is enabled when the CS signal is toggled high, and the voltage at the LPD node 435 goes low.

Figure 9:
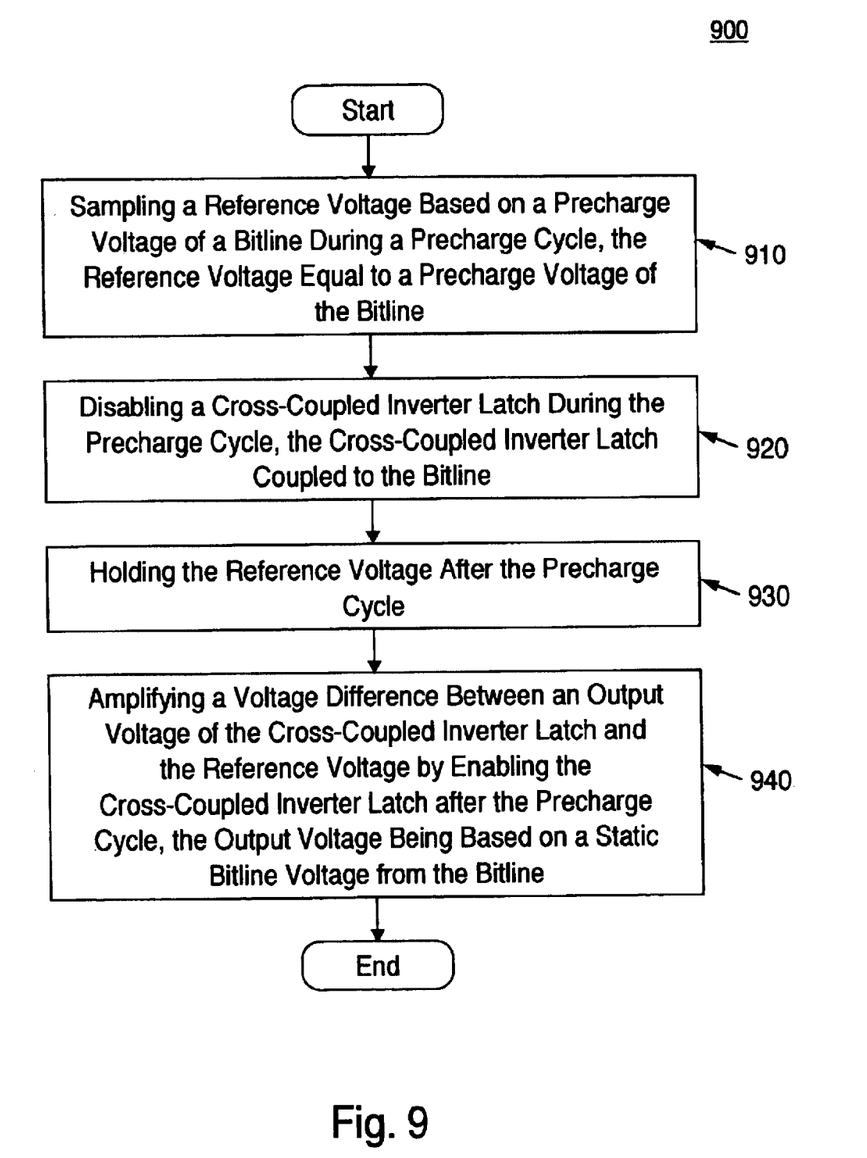
FIG. 9 is a flow chart illustrating steps in a method for sampling and holding a reference voltage in a sensing circuit, in accordance with one embodiment of the present invention.

FIG. 9 is a flow chart 900 illustrating steps in a computer implemented method for sampling and holding a reference voltage in a sensing circuit, in accordance with one embodiment of the present invention. The present embodiment begins by sampling a reference voltage based on a precharge voltage of a bitline during a precharge cycle, in step 910. Previously, the bitline was precharged to the precharge voltage.

In one embodiment, the reference voltage is equal to a precharge voltage from the bitline. Normally, there is no voltage drop between the precharge voltage and the reference voltage. However, there will be a threshold drop across the pass gate of the pass transistor (e.g., gate of MNIN1 447) when the voltage on the pass gate is less than or equal to the precharge voltage of the bitline plus a threshold voltage. In that case, the threshold voltage is the precharge voltage less the threshold voltage. In either case, the present embodiment is able to avoid the costly process of generating a reference voltage by using the existing precharge voltage on the bitline associated with a memory cell being read.

In step 920, the present embodiment disables a cross-coupled inverter latch during the precharge cycle. The cross-coupled inverter latch is coupled to the bitline associated with the memory cell being read. More specifically, the cross-coupled inverter latch is disabled by reaching a stable state during the precharging cycle. In the stable state, the reference voltage is equal to a precharged output voltage of the cross-coupled inverter latch. The precharged voltage is based on a precharged voltage from the bitline.

Further, to disable the cross-coupled inverter latch during the precharge cycle, the present embodiment pulls down a latch pull up (LPU) node in the cross-coupled inverter latch to disable an upper first inverter amplifier comprising the cross-coupled inverter latch. Similarly, the present embodiment pulls up a latch pull down (LPD) node in the cross-coupled inverter latch. This is done to disable a lower second inverter amplifier comprising the cross-coupled inverter latch.

In step 930, the present embodiment holds the reference voltage after the precharge cycle. The reference voltage is used to determine the state of the memory cell associated with the bitline. In one embodiment, the reference voltage is held using capacitive elements in the sensing circuit.

In step 940, the present embodiment amplifies a voltage difference between an output voltage of the cross-coupled inverter latch and the reference voltage. The present embodiment accomplishes this by enabling the cross-coupled inverter latch after the precharge cycle. The output voltage is based on the static bitline voltage from the bitline. The voltage on the bitline reaches a steady slate to achieve the static bitline voltage.

The present embodiment amplifies the voltage difference between the output voltage and the reference voltage by pulling the greater of the output voltage and the reference voltage to a high voltage (e.g., the supply voltage). In addition, the present embodiment pulls the lesser of the output voltage and said reference voltage through said cross-coupled inverter latch to a low level to amplify the voltage difference between the output voltage and the reference voltage.

In another embodiment, returning to FIG. 4, the capacitor CAP1 490 is replaced with a weak pull up path to the bitline. By adding current to the bitline, the voltage on the bitline will charge up high if the data on the memory cell indicates it is in a programmed state (0). As long as the memory cell in its erased state sinks more current than the injected current into the bitline, then the reference voltage is effectively the precharge level, and the bitline either charges higher or discharges lower.

In still another embodiment, in the ease of programmed memory cells that leak current on the bitline, a weak pullup in current that is matched to the maximum allowable leakage current can be added to the bitline. This cancels out the leakage current. As long as this weak pullup current provides less current than is apparent from a memory cell that is in an erased state, then the reference voltage is effectively the precharge level, and the bitline either charges higher or discharges lower.

The preferred embodiment of the present invention, a sense amplifier that is capable of sampling and holding a reference signal based on a precharged voltage of a bitline associated with a memory cell being read, is thus described. While the present invention has been described in particular embodiments, it should be appreciated that the present invention should not be construed as limited by such embodiments, but rather construed according to the below claims.

What is claimed is:

1. A sample and hold sense amplifier circuit comprising:
    a reference voltage sampler circuit coupled to a bitline of a memory cell, said reference voltage sampler circuit for sampling a reference voltage from a precharge voltage of said bitline, said reference voltage for reading a state on a memory cell;
    a cross-coupled inverter latch coupled to said reference voltage sampler circuit and coupled to said bitline, said cross-coupled inverter latch for amplifying a voltage difference between an output voltage of said cross-coupled inverter latch and said reference voltage, said output voltage being based on a static bitline voltage from said bitline.

2. The sample and hold sense amplifier of claim 1, further comprising:
    a precharge transistor circuit coupled to said cross-coupled inverter latch, said precharge transistor circuit for achieving a stable state in said cross-coupled inverter latch during a precharging cycle in which said reference voltage is sampled; and
    a sensing circuit coupled to said cross-coupled inverter latch to enable said cross-coupled inverter latch to amplify said voltage difference after said precharging cycle.

3. The sample and hold sense amplifier of claim 2, wherein in said stable state said reference voltage is equal to said output voltage of said cross-coupled inverter latch.

4. The sample and hold sense amplifier of claim 2, wherein said reference voltage during said stable state is approximately equal to said bitline precharge voltage.

5. The sample and hold sense amplifier of claim 1, wherein said precharge transistor circuit further comprises:
    a precharge pulling circuit coupled to said cross-coupled inverter latch, said precharge pulling circuit for disabling said cross-coupled inverter latch when sampling said reference voltage, and for enabling said cross-coupled inverter latch when amplifying said voltage difference.

6. The sample and hold sense amplifier of claim 5, wherein said precharge pulling circuit further comprises:
    a precharge pull up circuit coupled to a first node in said cross-coupled inverter latch, said precharge pull up circuit for disabling a first inverter amplifier in said cross-coupled inverter latch when sampling said reference voltage by pulling said first node low; and
    a precharge pull down circuit coupled to a second node in said cross-coupled inverter latch, said precharge pull down circuit for disabling a second inverter amplifier in said cross-coupled inverter latch when sampling said reference voltage by pulling said second node high.

7. The sample and hold sense amplifier of claim 6 further comprising:
    a pull up circuit coupled to said first node, said pull up circuit for enabling said first inverter amplifier when amplifying said voltage difference by pulling said first node high; and
    a pull down circuit coupled to said second node, said pull down circuit for enabling said second inverter amplifier when amplifying said voltage difference by pulling said second node low.

8. The sample and hold sense amplifier of claim 1, further comprising:
    a sensing circuit coupled to said cross-coupled inverter latch, said sensing circuit for swinging to a high voltage the greater of said bitline voltage and said reference voltage through said cross-coupled inverter latch, and swinging to a low voltage the lesser of said bitline voltage and said reference voltage through said cross-coupled inverter latch to amplify said voltage difference.

9. The sample and hold sense amplifier of claim 8, wherein said high voltage is a supply voltage to said cross-coupled inverter latch, and said low voltage is ground.

10. A sample and hold sense amplifier circuit comprising:
    a first pass gate transistor coupled to a bitline of a memory cell for passing voltage from said bitline, said first pass gate transistor controlled by a first precharge signal;
    a second pass gate transistor coupled to said bitline for passing said voltage from said bitline, said second pass gate transistor controlled by a second precharge signal;
    a reference voltage sampler circuit coupled to said first pass gate transistor, said reference voltage sampler for sampling and holding a reference voltage determined from a precharge voltage of said bitline; and
    a cross-coupled inverter latch coupled to said first pass gate transistor and said second pass gate transistor, said cross-coupled inverter latch for amplifying a voltage difference between an output voltage of said cross-coupled inverter latch and said reference voltage, said output voltage based on a static bitline voltage from said bitline.

11. The sample and hold sense amplifier circuit of claim 10, further comprising:
    a plurality of capacitive elements for holding said reference voltage when amplifying said voltage difference.

12. The sample and hold sense amplifier circuit of claim 10, further comprising:
    a precharge transistor circuit coupled to said cross-coupled inverter latch, said precharge transistor circuit for achieving a stable state in said cross-coupled inverter latch during a precharging cycle in which said reference voltage is sampled; and
    a sensing circuit coupled to said cross-coupled inverter latch for enabling said cross-coupled inverter latch to amplify said voltage difference after said precharging cycle.

13. The sample and hold sense amplifier circuit of claim 12, wherein said reference voltage during said stable state is approximately equal to said bitline precharge voltage.

14. The sample and hold sense amplifier circuit of claim 10, wherein said precharge transistor circuit further comprises:
    a precharge pull up circuit coupled to a node in said cross-coupled inverter latch, said precharge pull up circuit for disabling a first inverter amplifier in said cross-coupled inverter latch when sampling said reference voltage by pulling said node low, and for enabling said first inverter amplifier when amplifying said voltage difference by pulling said node high.

15. The sample and hold sense amplifier circuit of claim 10, wherein said precharge transistor circuit further comprises:
    a precharge pull down circuit coupled to a node in said cross-coupled inverter latch, said precharge pull down circuit for disabling a second inverter amplifier in said cross-coupled inverter latch when sampling said reference voltage by pulling said node high, and for enabling said second inverter amplifier when amplifying said voltage difference by pulling said node low.

16. The sample and hold sense amplifier circuit of claim 10, further comprising:

a shorting circuit coupled to said cross-coupled inverter latch, said shorting circuit for equalizing said reference voltage and said output voltage when said reference voltage is sampled.

17. The sample and hold sense amplifier circuit of claim 10, wherein said second pass gate transistor inhibits current flow back to said bitline when amplifying said voltage difference.

18. The sample and hold sense amplifier circuit of claim 10, further comprising:

a current supply coupled to said bitline compensating for leakage current in said bitline.

19. A method for sampling and holding a reference voltage in a sensing circuit comprising:

a) sampling said reference voltage based on a precharge voltage of a bitline during a precharge cycle, said reference voltage equal to a precharge voltage of said bitline;

b) disabling a cross-coupled inverter latch during said precharge cycle, said cross-coupled inverter latch coupled to said bitline;

c) holding said reference voltage after said precharge cycle;

d) amplifying a voltage difference between an output voltage of said cross-coupled inverter latch and said reference voltage by enabling said cross-coupled inverter latch after said precharge cycle, said output voltage being based on a static bitline voltage from said bitline.

20. The method as described in claim 19, further comprising:

before a), precharging said bitline to said precharge voltage during said precharge cycle.

21. The method as described in claim 19, wherein b) further comprises:

b1) reaching a stable state in said cross-coupled inverter latch during said precharging cycle, such that, said reference voltage is equal to a precharged output voltage of said cross-coupled inverter latch, said precharged voltage being based on a precharged voltage from said bitline.

22. The method as described in claim 19, wherein b) further comprises:

b1) pulling down a latch pull up node in said cross-coupled inverter latch to disable a first inverter amplifier in said cross-coupled inverter latch; and b2) pulling up a latch pull down node in said cross-coupled inverter latch to disable a second inverter amplifier in said cross-coupled inverter latch, said second inverter amplifier coupled to said first inverter amplifier.

23. The method as described in claim 19, wherein c) further comprises:

c1) using capacitive elements to hold said reference voltage.

24. The method as described in claim 19, wherein d) further comprises:

d1) swinging to a high voltage the greater of said output voltage and said reference voltage through said cross-coupled inverter latch; and d2) swinging to a low voltage the lesser of said output voltage and said reference voltage through said cross-coupled inverter latch to amplify said voltage difference.

25. The method as described in claim 22, wherein d) further comprises:

d1) pulling up said latch pull up node to enable said cross-coupled inverter latch; and d2) pulling down said latch pull down node to enable said cross-coupled inverter latch.

26. The method as described in claim 19, further comprising:

compensating for leakage current from said memory cell by adding current to current from said bitline.

* * * * *